(12) United States Patent
Ohki

(10) Patent No.: US 6,590,779 B2
(45) Date of Patent: Jul. 8, 2003

(54) POP-UP MECHANISM AND A PC CARD HAVING IT

(75) Inventor: Yasuo Ohki, Tokyo (JP)

(73) Assignee: Honda Tsushin Kogyo Co. Ltd., Tokyo (JP)

( * ) Notice: Subject to any disclaimer, the term of this patent is extended or adjusted under 35 U.S.C. 154(b) by 0 days.

(21) Appl. No.: 10/115,475

(22) Filed: Apr. 2, 2002

(65) Prior Publication Data

US 2002/0145855 A1 Oct. 10, 2002

(30) Foreign Application Priority Data

Apr. 5, 2001 (JP) ........................................ 2001-106775

(51) Int. Cl.[7] ............................................... H05K 1/14
(52) U.S. Cl. ...................................................... 361/737
(58) Field of Search ................................. 361/737, 728, 361/730, 732, 740, 741, 747, 801, 802; 439/76.1, 152–159, 327, 372

(56) References Cited

U.S. PATENT DOCUMENTS

| | | | | |
|---|---|---|---|---|
| 5,564,936 A | * | 10/1996 | David et al. ................. | 439/157 |
| 5,573,413 A | * | 11/1996 | David et al. ................. | 439/157 |
| 5,863,212 A | * | 1/1999 | Duesterhoeft ............... | 439/160 |
| 5,871,365 A | * | 2/1999 | Kajiura ........................ | 439/159 |
| 5,899,763 A | * | 5/1999 | Kajiura ........................ | 439/159 |
| 6,074,227 A | * | 6/2000 | Ho et al. ..................... | 439/152 |
| 6,089,889 A | * | 7/2000 | Chiou et al. ................. | 439/157 |
| 6,155,853 A | * | 12/2000 | Kajiura ........................ | 439/159 |
| 6,261,128 B1 | * | 7/2001 | Heim et al. .................. | 439/326 |

* cited by examiner

*Primary Examiner*—David Martin
*Assistant Examiner*—Thanh S. Phan
(74) *Attorney, Agent, or Firm*—Leighton K. Chong

(57) ABSTRACT

The problem of the present invention is to provide a pop-up mechanism and a PC card having it, which enables the pop-up unit expands longer than past PC cards.

A heart-cam 10 is formed inside the frame 20 along the direction of expanding and receding of the pop-up unit 3, and a locking plate 16 having the locking pin 16A, which circulates endlessly in the groove of the heart-cam 10 as the expanding and receding of the mentioned pop-up unit 3, is fitted movably in the storage part of the locking plate 36 formed at the side of the pop-up unit.

5 Claims, 14 Drawing Sheets

(a)  (b)

POP-UP MECHANISM AND A PC CARD HAVING IT

BACKGROWND OF INVENTION

The invention relates to a pop-up mechanism and a PC card having it, in particular to a pop-up mechanism and a PC card having it with a pop-up unit (which is stored in a stored position of the main body) to expand to the outside by elasticity and be retained at the position.

RELATED ART

In connecting peripheral equipment to a note-type personal computer, as illustrated in the FIG. 14, the PC card 50 is installed in the PC card slot 62, which is provided in the note-type personal computer 60, and the peripheral equipment (not illustrated) is connected through the PC card 50. In recent years, a PC card for the wireless LAN is installed in the note-type personal computer and the note-type personal computer is used in the wireless LAN.

As shown in the FIG. 13, the conventional PC card for the wireless LAN 50 is manufactured covered both sides with a metallic shield cover 52 to protect a substrate inside the card and also to shield electronic devices such as semiconductors equipped with the substrate from outside electromagnetic waves. And an antenna of antenna portion 54, which receives and sends the radio wave, is not able to do so (receives and sends the radio wave) when located in the position where it is covered by the metallic shield. For this reason, the antenna portion 54 is always built in a way to stick out of an end of a thin-boarded main body of a PC card 56. Consequently, the antenna portion 54 always sticks out of the PC card slot 62, so that the antenna portion 54 can be hit or exerted with an external force in carrying the note-type personal computer. Still more, the antenna portion 54 equipped in this way doesn't look nice.

So, as illustrated in the FIG. 10(A) and the FIG. 10(B), a PC card 61 which makes an antenna unit 63 possible to be kept in a storage part for antenna unit 65 equipped in the main body of a PC card 62 by manufacturing the main body of the PC card 62 and the antenna unit 63 as separate parts is designed. In this PC card 61, the antenna unit 63 which is stored in the storage part 65 equipped in the main body of the PC card 62 expands to the outside by the elasticity of a coil-like spring 64 (which is illustrated in the FIG. 11) to be retained at the designated position. At the same time, the antenna unit 63 is pushed and goes back to be retained in the state of being stored in the storage part.

That is, as illustrated in the FIG. 12, in the conventional mechanism, a heart-cam 67 is formed at the side of the antenna unit 63 sticking out from the main body of the PC card 62, and an end of a mobile shaft in a crank shape 68 is fixed to the side of the main body of the PC card 62 with the other end is to be related to the heart-cam 67. And because of a plate-like string 69 whose end is fixed to the side of the main body of the PC card 62, the tip of the mobile shaft 68 is prevented from seceding from the heart-cam 67. Therefore, the antenna unit 63 is able to send and receive the radio wave at the position it expanded to against the main body of the PC card 62 by expanding to outside of the radio wave shield material of the main body of the PC card 62.

In such conventional mechanism, the longer groove of the heart-cam 67 has to be shaped longer so as to make the length to expand the antenna unit 63 longer than now.

However, when the longer groove is lengthen, the heart-cam 67 which is at the side of the antenna unit 63 also sticks out from inside to outside of the main body of the PC card 62 if the antenna unit 63 is expanding. If a part of the mechanism appears to outside, the mechanism can be damaged or wrongly operated. And if the user operates it wrongly, an accident can happen. Still more, the appearance of the mechanism to outside doesn't look nice.

So this invention presents a pop-up mechanism whose pop-up unit can expand longer than the conventional PC cards without the appearance of the mechanism outside and a PC card having it.

SUMMARY OF INVENTION

The invention to solve the mentioned problem is characterized in that in the pop-up mechanism in which the pop-up unit stored in the storage part formed with the frame in the main body expands the outside by the elasticity to be retained at the designed position and at the same time it is pushed to go back to be retained in the state of being stored in the storage part, a heart-cam is formed along the direction of the expanding and receding of the pop-up unit inside the frame and at the same time, a locking plate having a locking pin which circulate endlessly in the groove of the heart-cam as the pop-up unit expands and recedes is fixed as it can sway in the storage part of the locking plate which is formed at the side of the pop-up unit.

The heart-cam is formed in the side of the frame and the locking plate having the locking pin which circulate endlessly in the groove of the heart-cam is formed at the side of the pop-up unit which is a mobile body moving relatively.

The invention to solve the mentioned problem is characterized in that in the pop-up mechanism, the dropping off preventing part is formed as a cantilever behind the locking plate of storage part of the locking plate and it prevents the locking pin from running off the groove of the heart-cam.

The invention to solve the mentioned problem is characterized in that in the pop-up mechanism, the locking pin isn't formed at the center of the locking plate.

The heart-cam is to sway with as small swinging angle as possible.

The invention to solve the mentioned problem is characterized in that in the pop-up mechanism, the pop-up unit is to expand outside by the elasticity of a coil spring. The coil spring is installed to the supporting pin which is fixed to the frame along the direction of the expanding and receding of the pop-up unit and inserted not to run off in a guide groove whose section is in about the shape of the letter "C" and whose tip is formed in at the pop-up unit, and the supporting pin is formed having enough length so that its tip reaches to the guide groove in the pop-up unit when the pop-up unit is retained at the expanded position.

The invention to solve the mentioned problem is characterized in that in the PC card having the pop-up mechanism, the pop-up unit is stored in the storage part formed in a thin plate-like main body of the card (the most of the top and bottom parts of which is covered by the radio wave shield material). The pop-up unit goes back to be retained in the state of being stored in the storage by pushing in the pop-up unit. The heart-cam is formed inside the frame along the direction of the expanding and receding of the pop-up unit and a locking plate having a locking pin which circulates endlessly in the groove of the heart-cam as the pop-up unit expands and recedes is fixed as it can sway in the storage part of the locking plate which is formed at the side of the pop-up unit.

This invention is possible to obtain further advantageous changes and refinements in the scope of the claims without deviating from the spirit of invention. The present invention includes these changes and refinements.

BRIEF EXPLANTION OF THE DRAWINGS

Figure 10:
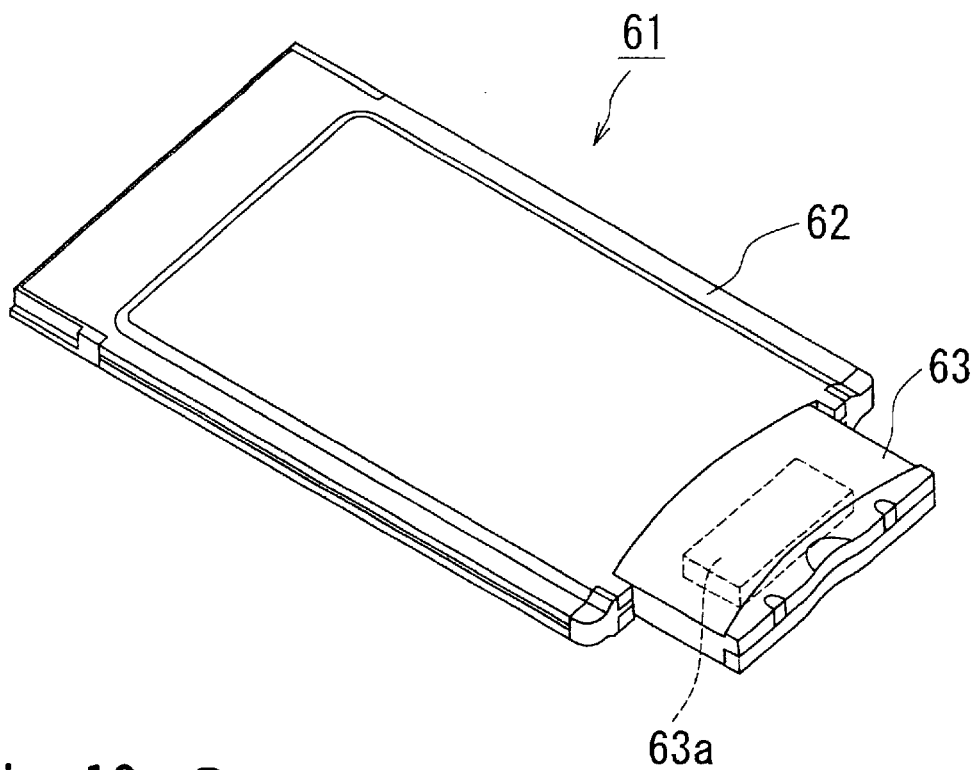
Figure 10:
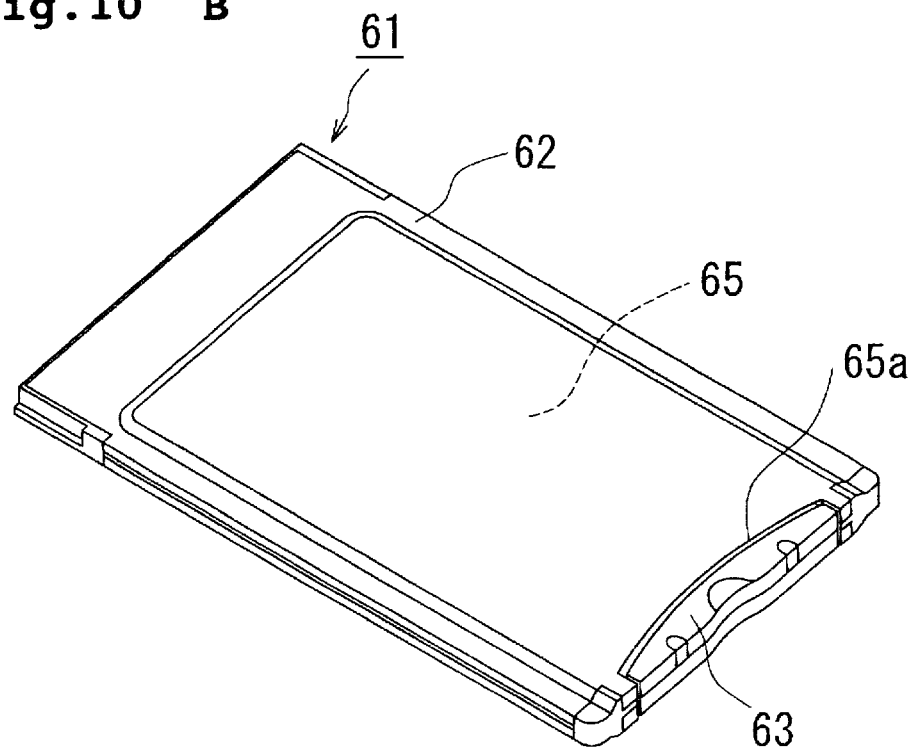

FIGS. 10(A) and (B) are perspective views of past PC cards; (A) is a diagram of the pop-up unit in the expanded position, and (B) is a diagram of the pop-up unit in the stored position.

Figure 11:
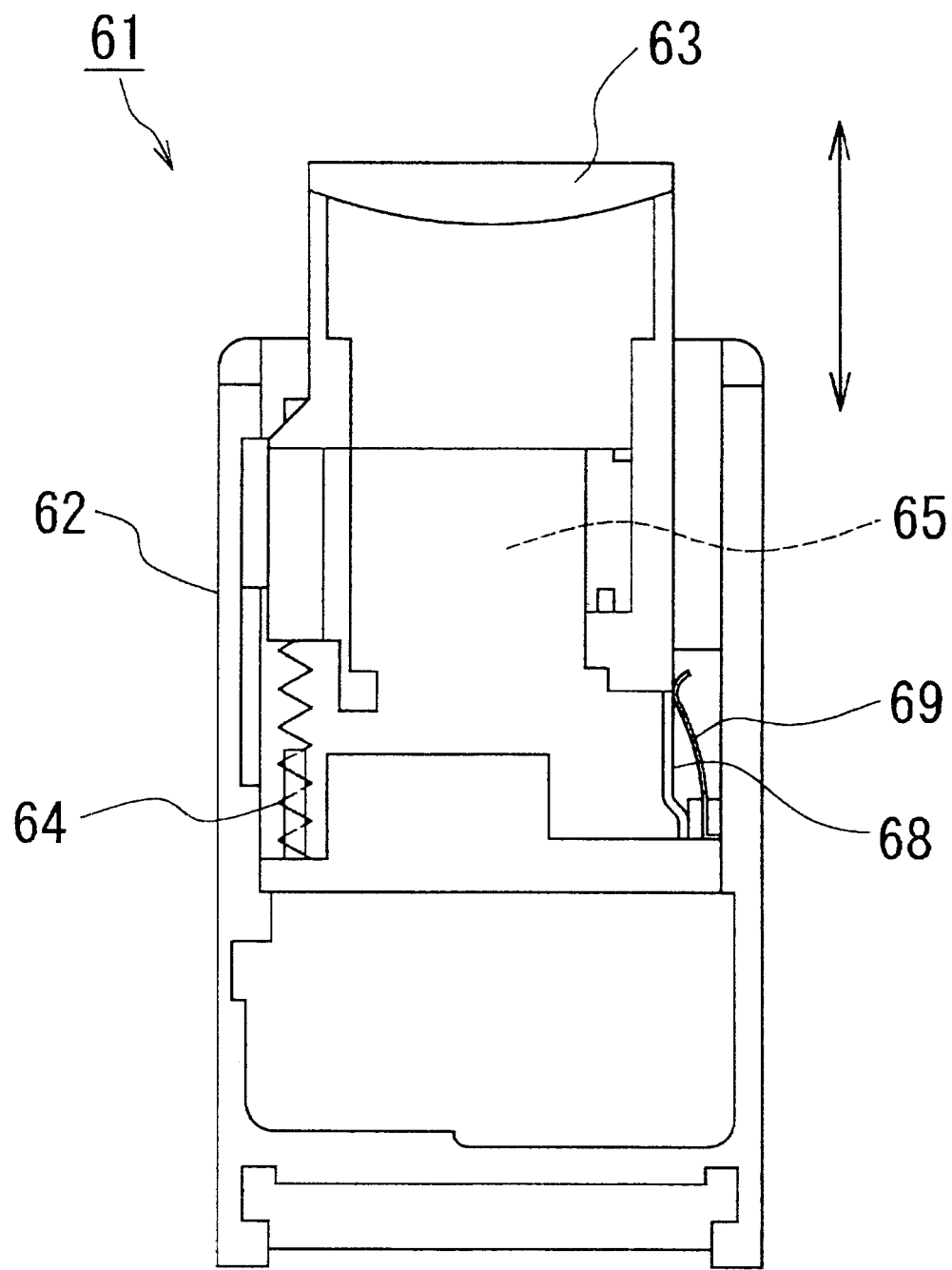

FIG. 11 is a ground plan of inside of the pas PC card.

Figure 12:
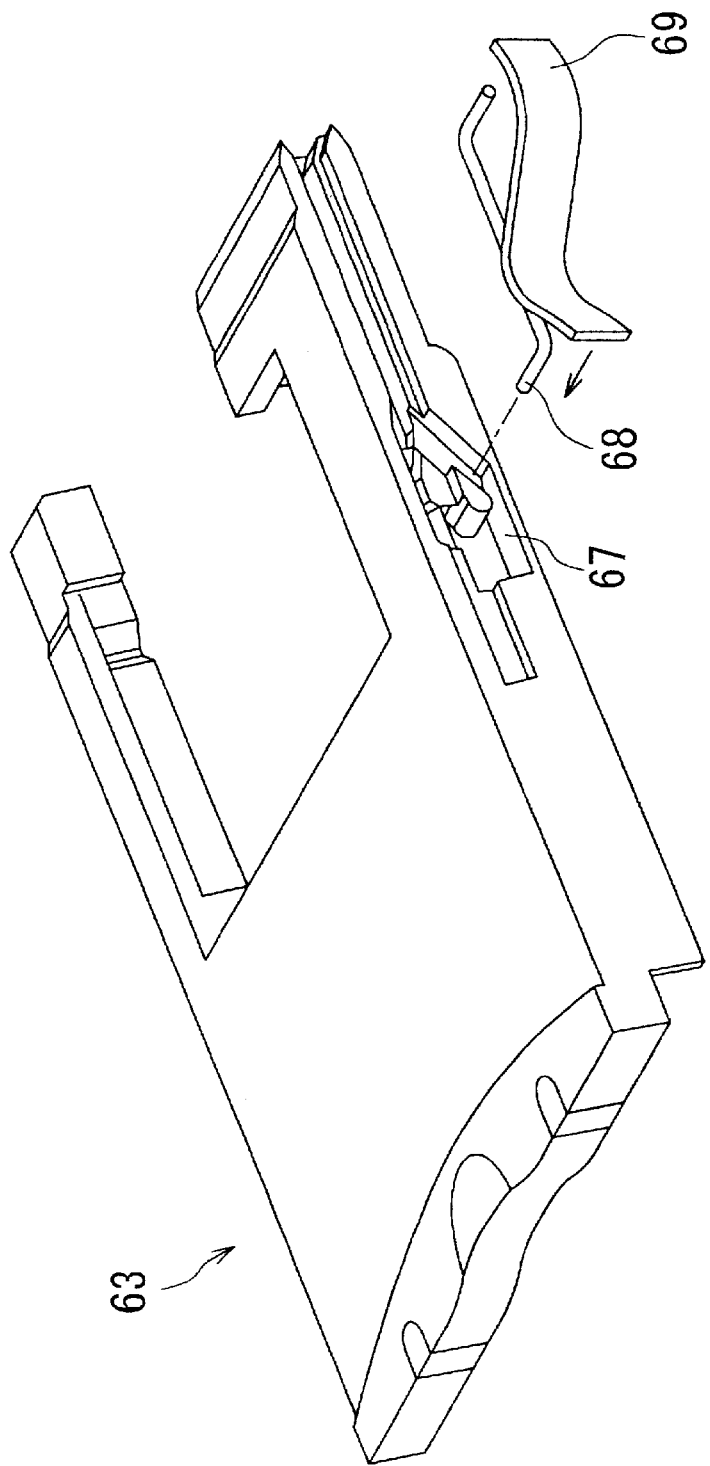

FIG. 12 is a perspective view of past pop-up mechanism.

Figure 13:
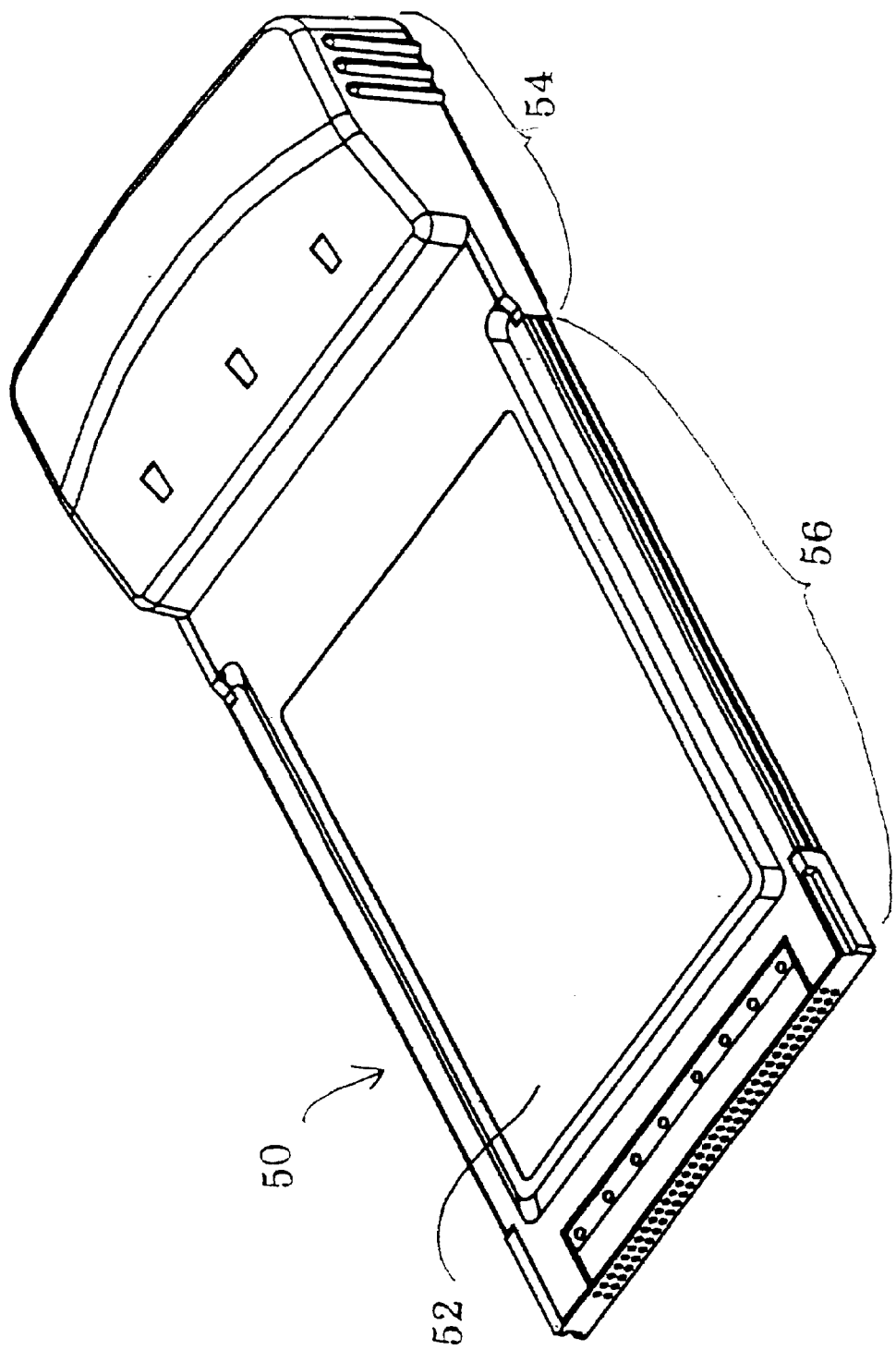

FIG. 13 is a perspective view of past PC card having the antenna unit inside.

Figure 14:
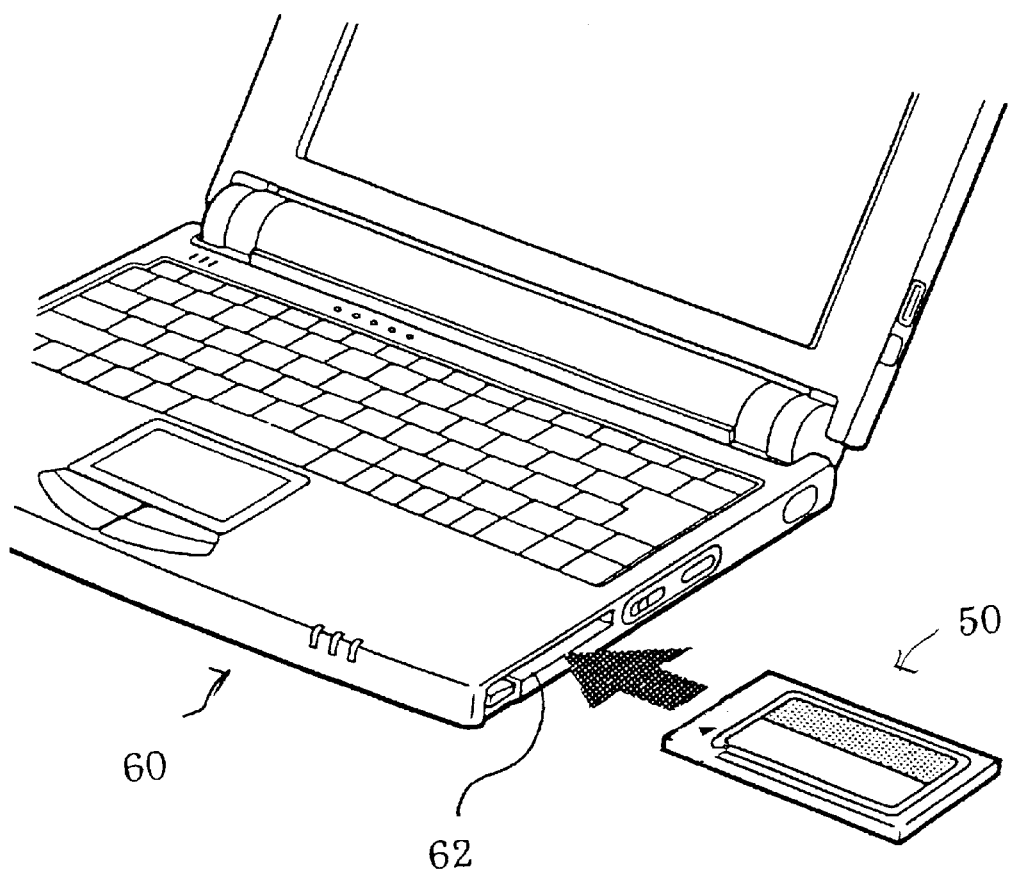

FIG. 14 is a perspective view for explaining the condition of inserting the PC card into the note type computer.

BEST MODES FOR EMBODYING THE PRESENT INVENTION

Figure 1:
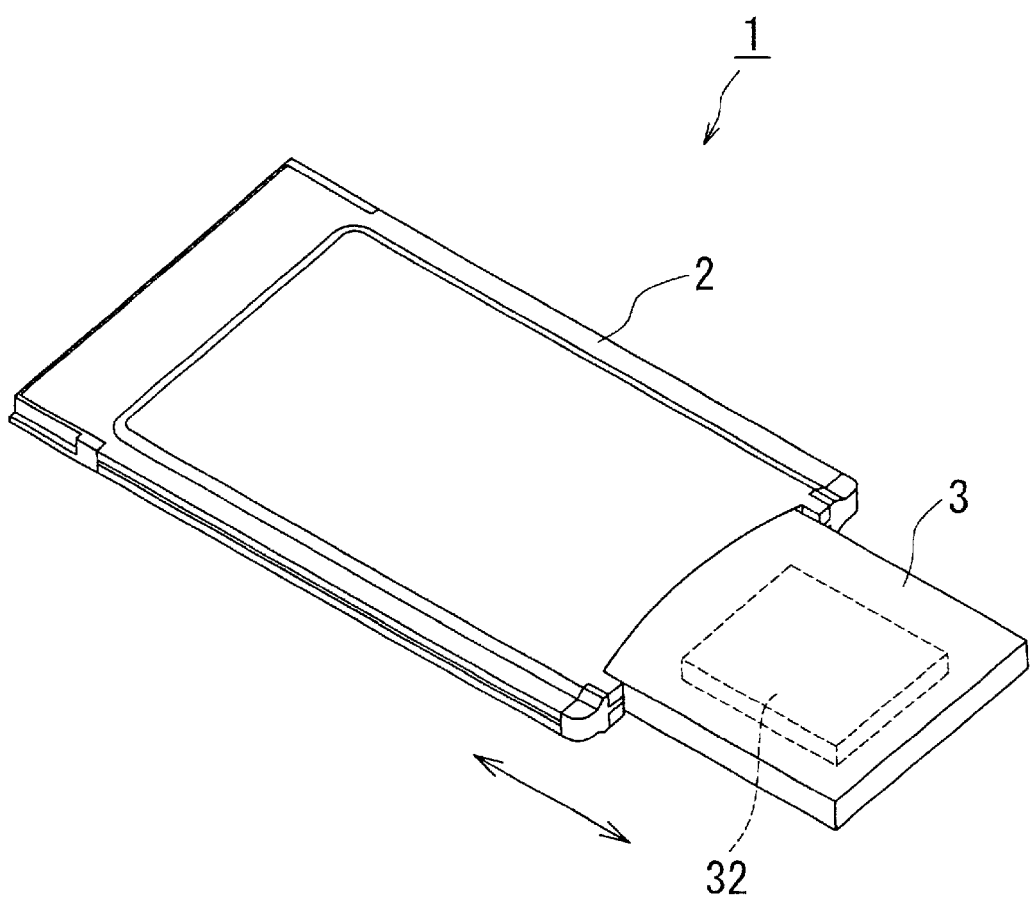
FIG. 1 is a perspective view of one embodiment of a PC card having a pop-up mechanism of this invention.
Figure 2:
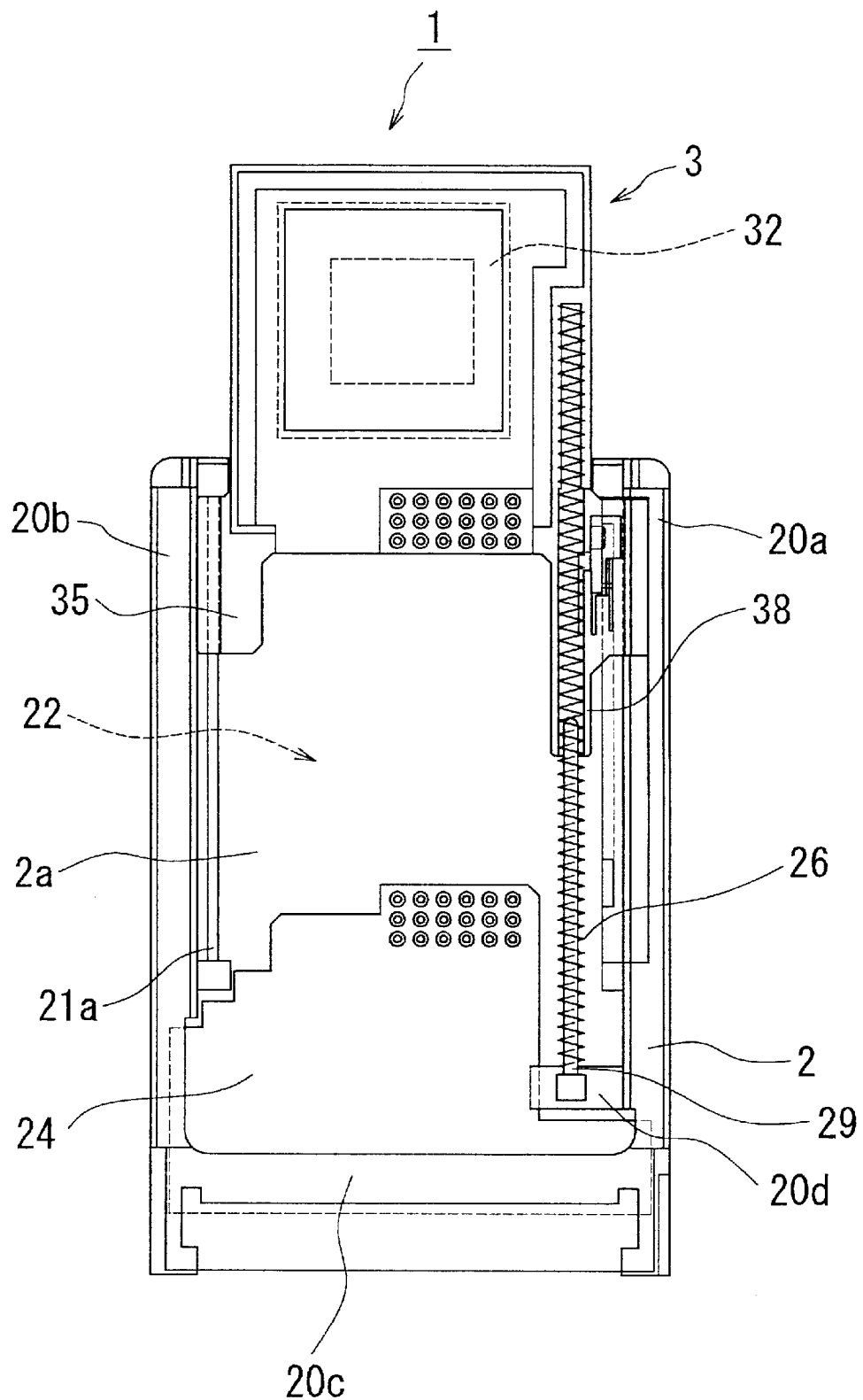
FIG. 2 is a cross section of the pop-up unit in the expanded position in time of using.
Figure 3:
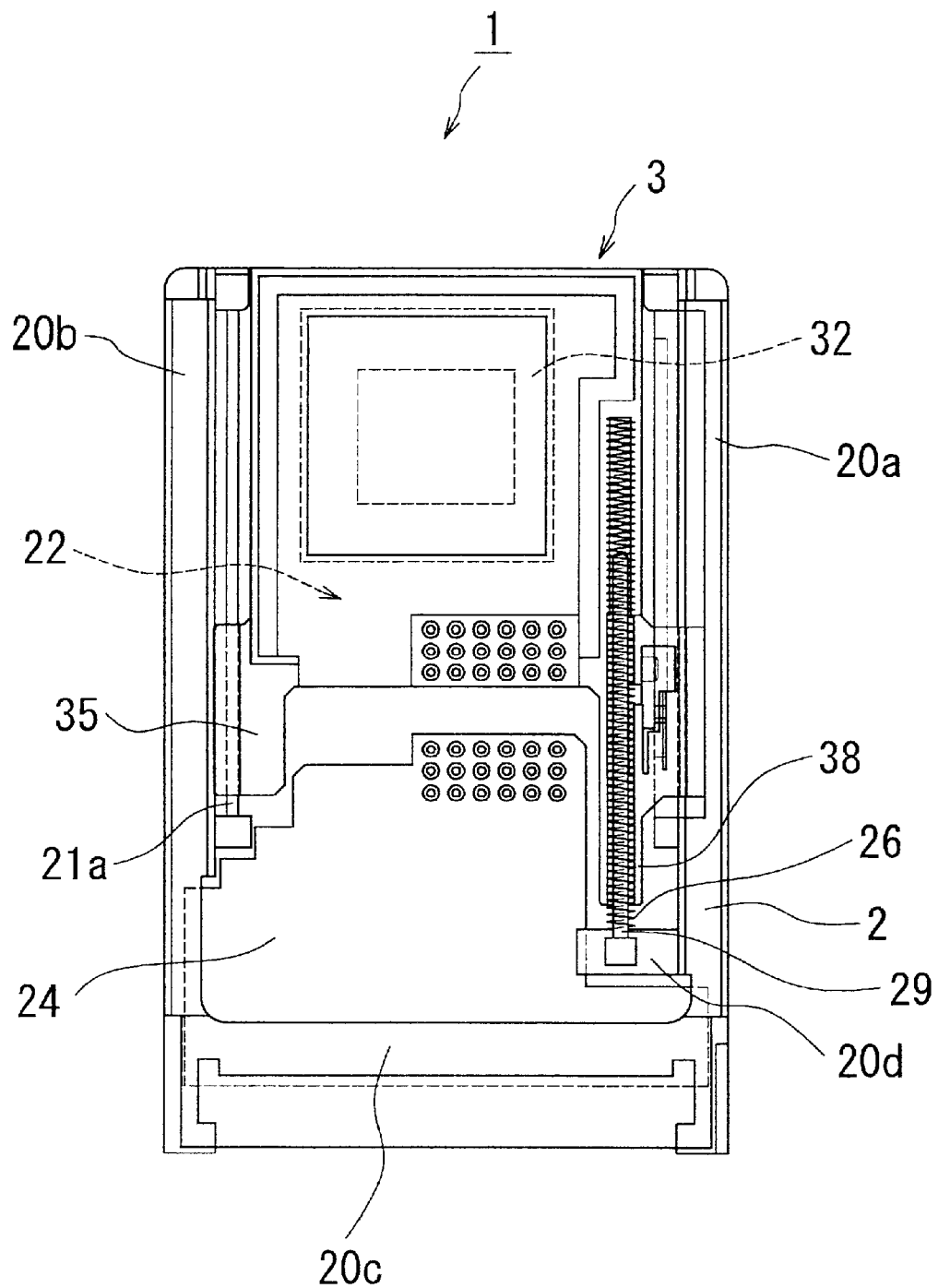
FIG. 3 is a cross section of the pop-up unit in the stored position in time of not using.

FIG. 1 is a perspective view of one embodiment of the PC card having the pop-up mechanism according to the present invention, FIG. 2 shows the pop-up unit in the expanded position when the PC card is being used, and FIG. 3 shows the pop-up unit in the stored position when the card is not being used.

The PC card 1 having the pop-up unit, as shown in the FIG. 1, roughly speaking comprises the main body 2 and the pop-up unit 3. They are manufactured as separate parts and the pop-up unit 3 is mounted within the main body 2 to take two positions, the expanding position and the stored position along the longer hand of the main body 2. As illustrated in FIG. 2, when the PC card is being used, the pop-up unit 3 is expanded outside of the metallic shield material of the main body 2 and retained there. On the other hand, as illustrated in the FIG. 3, when the card is not being used, the entire pop-up unit 3 is substantially stored inside the main body 2 and retained there. When the pop-up unit 3 is pressed down deep inside of the PC card 2 from the condition of the FIG. 3, by the mechanism according to the present invention, the pop-up unit is pushed out from the condition illustrated in the FIG. 3 to the condition illustrated in FIG. 2 by the force of the coil-like spring and is retained.

According to the illustration of the FIG. 2 and the FIG. 3, the main body of the PC card 2 in roughly speaking comprises a metallic upper (not illustrated) and a lower covers 2A, and the frame 20, which is being sandwiched by the covers 2A. And with this frame 20, the storage part 22 to store the pop-up unit 3 inside the main body of the PC card 2 is formed.

The plastic frame 20 is about in the shape of the letter "H" and formed as an integrated structure, inside of which a substrate 24, which interchanges the information between the computer and a coil spring, which expands the pop-up unit 3, are fixed to.

Figure 4:
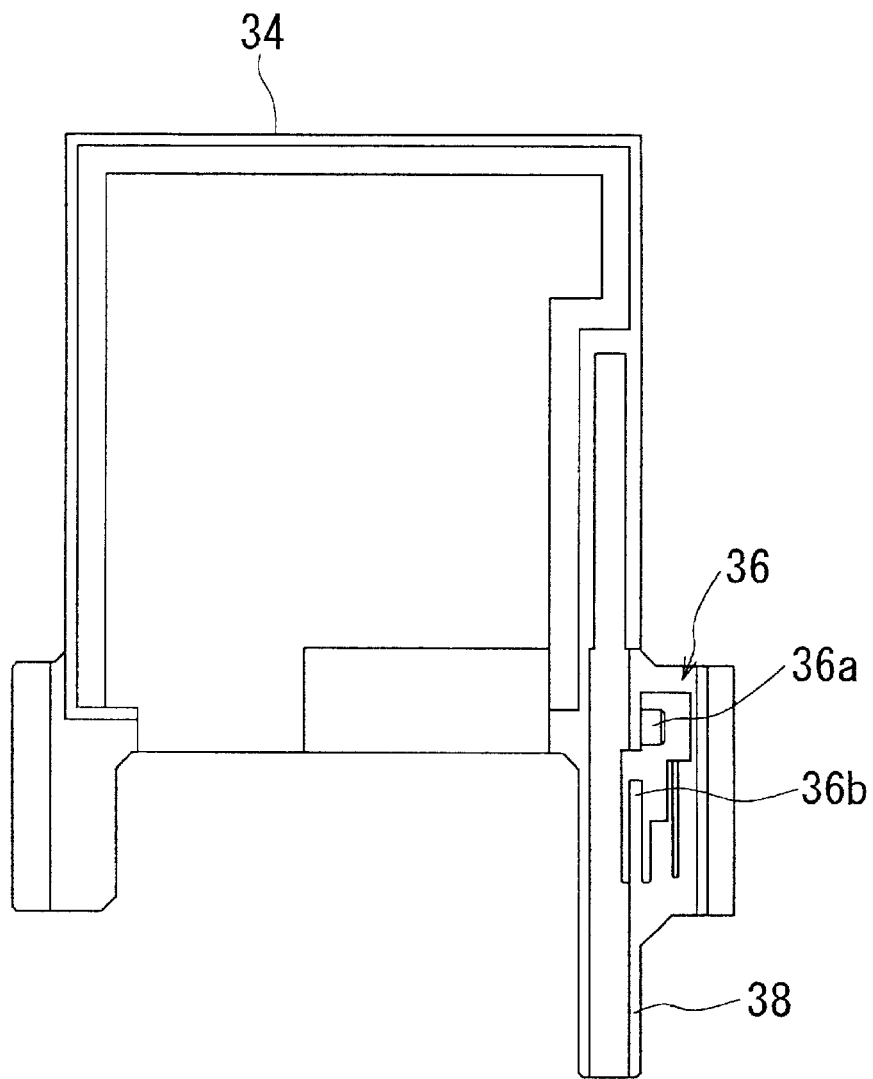
FIGS. 4(A) is a ground plan of the lower plate, and (B) is a front view of it.
Figure 4:
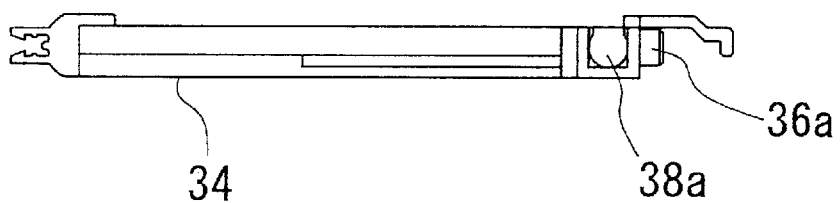

On the other hand, the pop-up unit 3, as shown in the FIG. 4(A), comprises a plastic upper plate (not illustrated) and a lower plate 34, and a substrate 32 which is loaded with designed functions as an antenna unit for the wireless LAN, a sensor of fingerprints and so on is being sandwiched by those plates.

Figure 5:
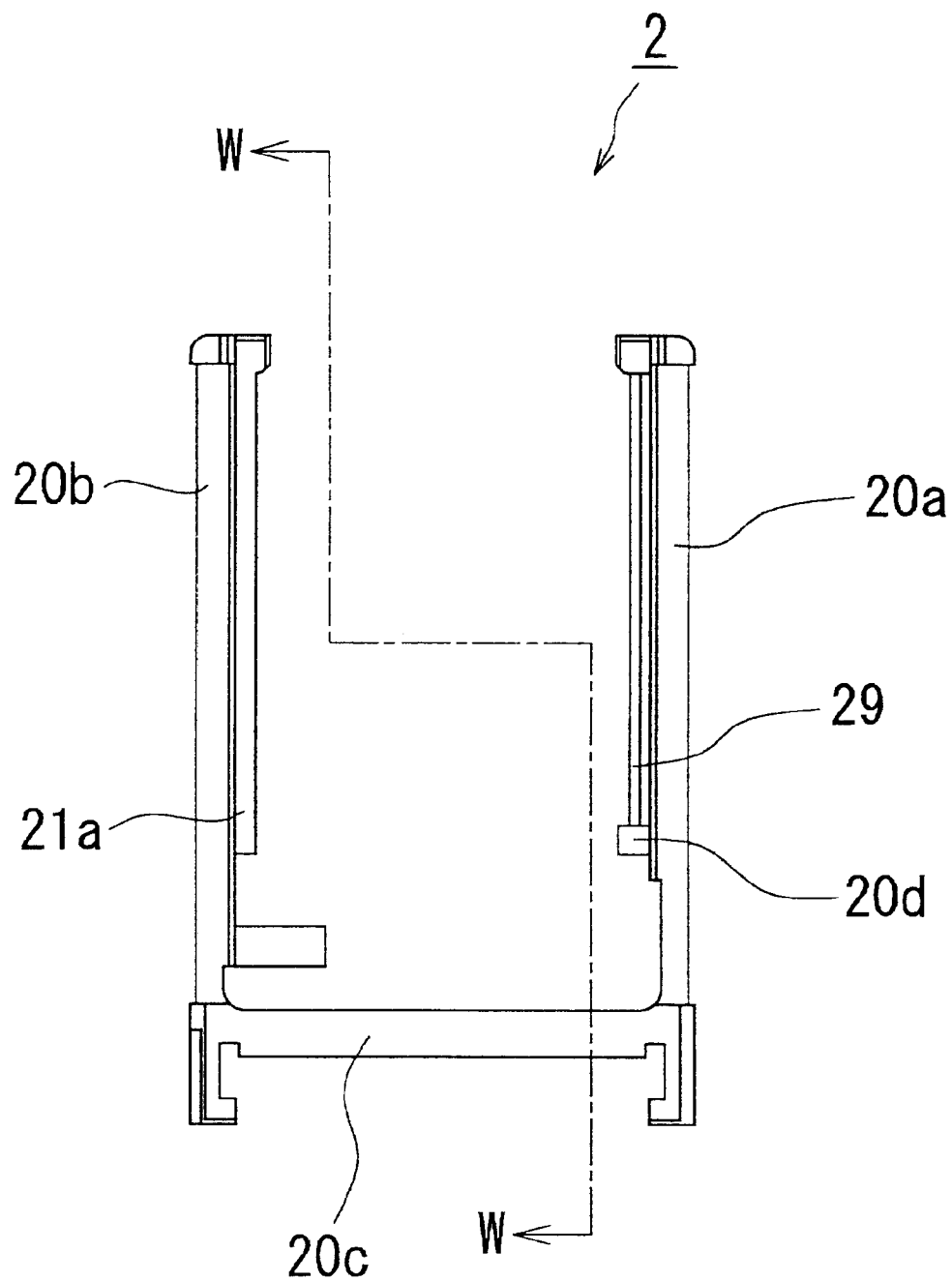
FIG. 5 is a ground plan of the frame.

As illustrated in the FIG. 5, the frame 20 includes a pair of side frame parts 20A, 20B which are located in the distance almost the same as the width of the PC card 1, and the bridge part 20C which connect strongly the side frame parts 20A and 20B. The space surrounded by a pair of the side frame parts 20A, 20B and the substrate 24 is a storage part for the pop-up unit 22, used to store the pop-up unit 3. By doing so, the thinness of the main body of the PC card 2 is achieved.

Figure 8:
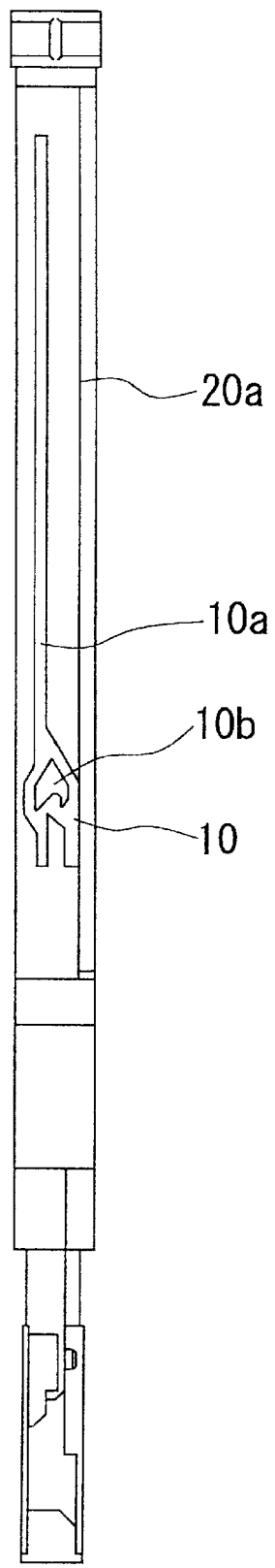
FIG. 8 is a side view of the heart-cam, which is formed at the side frame part.

At inside of one side of the side frame part 20A, as illustrated in the FIG. 8, a heart-cam 10 is formed along the direction of the expanding and receding of the pop-up unit 3.

At inside of the other side of the side frame part 20B, a guide plate 21A, which guides the pop-up unit 3, to slide along the direction of the expanding and receding is formed along the direction of the longer hand. By the way, to the lower plate 34 of the pop-up unit 3 (which will be mentioned later), an holder 35 which holds and enables to slide this guide plate 21A is formed, and by doing this, the pop-up unit 3 is exactly guided to expand and recede and prevented from rattling when it expands and recedes.

The heart-cam 10 comprises a longer groove 10A, which is formed along the direction of the longer hand inside the side frame part 20A, and a heart-shaped retaining part 10B formed at the end side of the longer groove 10A (i.e. the expanding side of the pop-up unit 3), and a locking pin 16A (which will be mentioned later) which sticks out from the locking plate 16 is to circulate endlessly.

The lower plate 34 is formed as an integrated structure by the plastic. As illustrated in the FIG. 4(A), at one side of this lower plate 34, there is a storage part of the locking plate 3 to store the locking plate 16, and at the opposite side of it, as mentioned above, there is a holder 35, which holds and enables to slide this guide plate 21A is formed.

Figure 7:
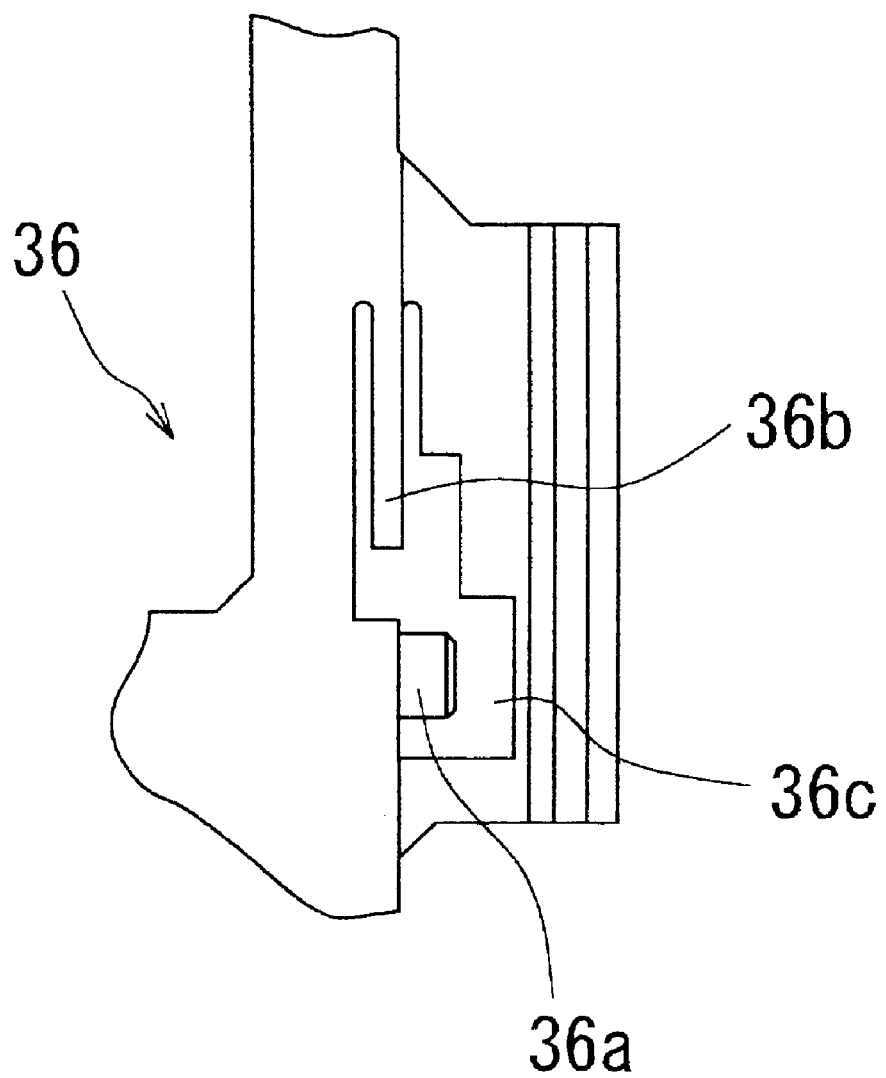
FIG. 7 is an expanded ground plan of the storage part of the locking plate.

The FIG. 7 is the expanded ground plan of the storage part for the locking plate 36. As shown in detail in the FIG. 7, the storage part for the locking plate 36 comprises the open space 36C to store the locking plate 16, a projection part 36A which enables the locking plate 16 to movably fit to and a holding part 36B which prevents the locking plate 16 from running off the heart-cam 10.

The projection part 36A is in the columnar shape so as to receive the hole 16B in the locking plate 16 as it can swing.

The holding part 36B is formed as a cantilever in the storage part for the locking plate 16, and holds the locking plate 16 with moderate elasticity behind the locking plate 16 so as not the locking plate 16 to run off the heart-cam 10. So far, a plate-like string 69 has prevented the tip of the mobile shaft 68 from running off the heart-cam 67, but by forming it as an integrated structure as the lower plate 34, the number of the components can be reduced and one manufacturing process can be cut down.

And when the pop-up unit 3 is stored in the storage part for the pop-up unit 22, the coil spring 26 is shrank with its diameter getting bigger a little. In this condition, the side of the coil spring 26 touches the holding part 36B with moderate elasticity and it prevents the running off of the locking plate 16 effectively.

Figure 6:
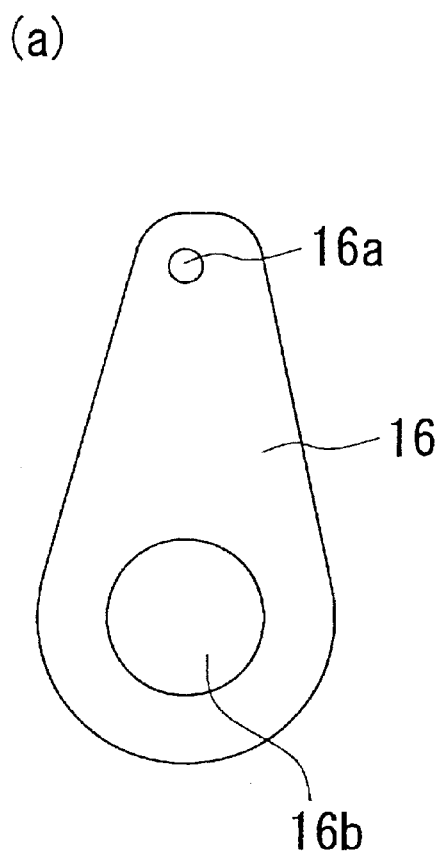
FIGS. 6(A) is a ground plan of the locking plate, and (B) is a side view of it.
Figure 6:
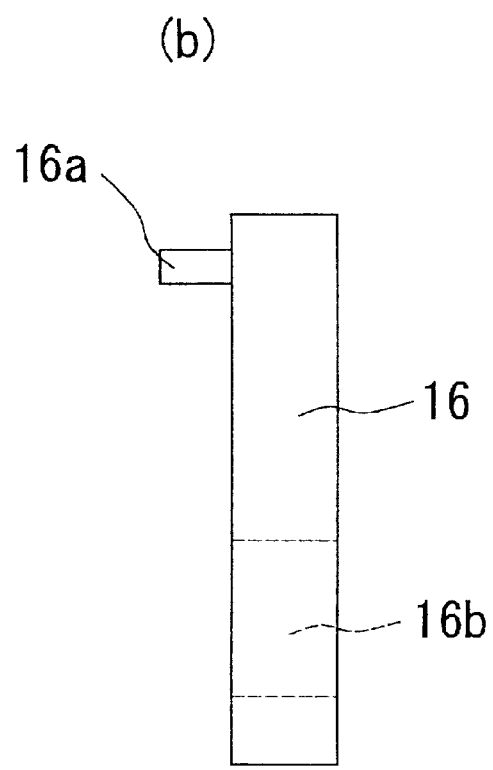

The locking plate 16 is designed, as shown in the FIG. 6, as the cross section of which takes the form of about an eggplant, which has the locking pin 16A in the narrower side, and a hole 16B that enables the locking plate 16 to be movably fitted to a projection part 36A in the opposite wider part. The locking pin 16A is formed at a little bit off the center so that it can swing with as small amplitude as possible at the retaining part 10B of the heart-cam 10.

In the lower plate 34, a leg 38 is formed as it extends more from the storage part of the locking plate 36 and a guide groove 38A, which is used to store a coil spring 26 into the leg 38 and whose section takes the shape of about the letter "C". The reason why the section of the guide groove 38A takes the shape of about the letter "C" is to prevent the cylindrical coil spring 26, which is to be stored inside of the guide groove 36 from running off. So the diameter of the guide groove 36A is designed to be a little wider than that of the coil spring 26, and the length of the opening of the guide groove 36A is designed to be a little narrower than that of the coil spring 26.

By the way, at the edge of the side frame part 20A, which is opposite to the part the pop-up unit 3 is fixed to, a fixing part 20D is formed sticking out to inside, and a bar-like supporting pin 29 is fixed to the fixing part 20D. And the coil-like spring 26 is fixed to the fixing part 20D.

The tip of the supporting pin 29 has enough strength to reach to the guide groove 38A, which is formed in the leg 38 in the pop-up unit 3 when the pop-up unit expands and whose section takes the shape of about the letter "C". By this construction, the coil spring 26, which is fixed to the supporting pin 29, is guided to the guide groove A in the leg 38 formed in the lower plate 34, and prevents the coil spring 26 from deformation or secession when it contracts. And the supporting pin 29 can be formed as an integrated structure as the frame 20 or be fixed by snapping into the frame 20, with the supporting pin 29 as another part.

Secondly, the action of mentioned pop-up mechanism will be explained using the FIG. 9 as follows. The FIG. 9 is a perspective view, which illustrates the connection of the heart-cam 10 and the locking plate 16.

Figure 9:
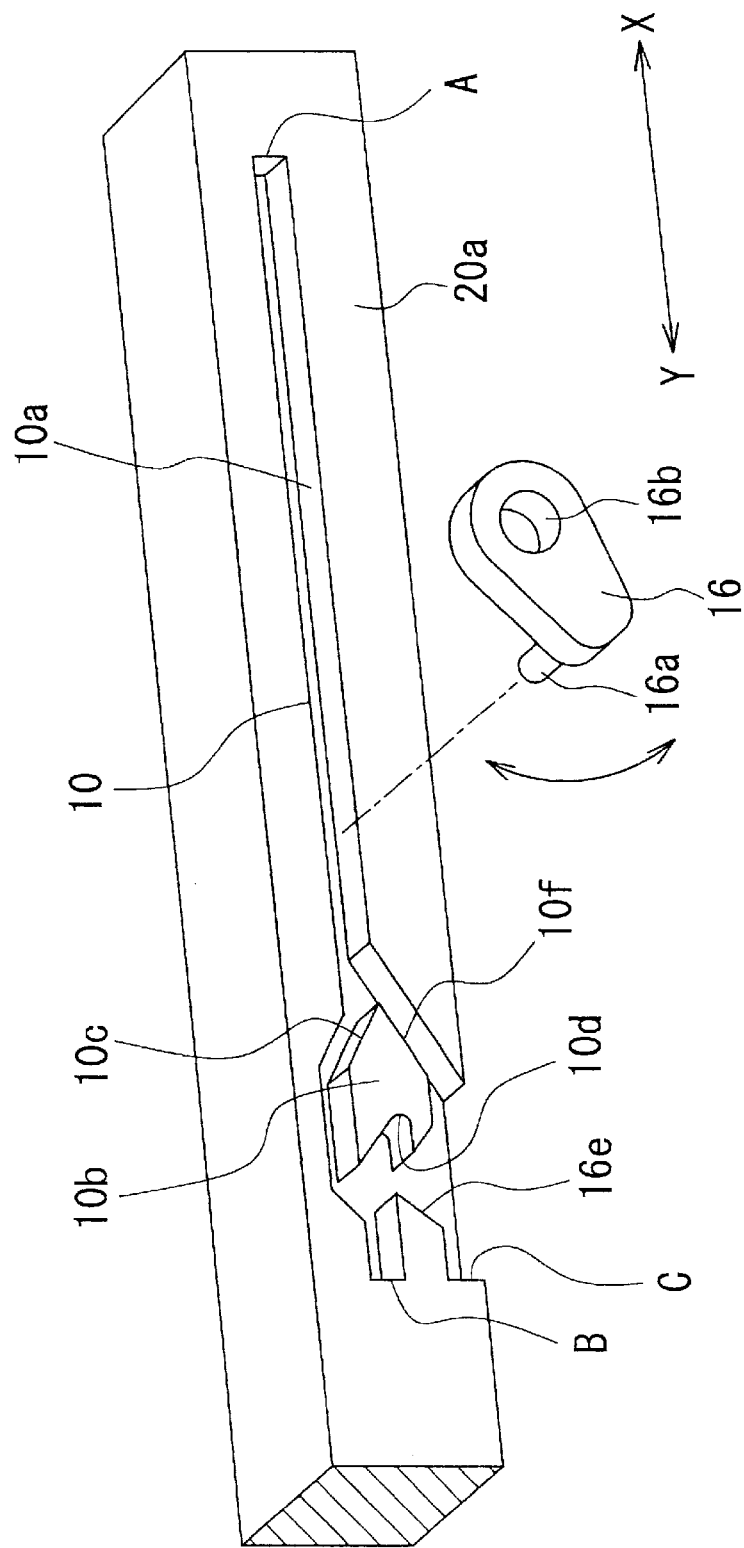
FIG. 9 is a perspective view, which illustrates the connection of the heart-cam and the locking plate.

First, when the pop-up unit 3 is expanded and used, the pop-up unit 3 is pushed from the main body of the PC card 2 toward the direction Y of the FIG. 9 by the elasticity of the coil spring 26 (as illustrated in the FIG. 2). Under this condition, the locking pin 16A of the locking plate 16 adjoins the back end of the longer groove 10A of the heart-cam 10 (the point A in the FIG. 9) so that the pop-up unit 3 is retained as it expands from the main body of the PC card 2, Then the pop-up unit 3 is pushed toward inside (the direction X) to store in the storage part of the pop-up unit 22, the coil spring 26 is compressed and gradually contracted as the locking pin 16A moves in the longer groove 10A toward the direction Y And when the pop-up unit 3 is pushed, the locking pin 16A is guided to slide in the first slope 10C of the retaining part 10B and as that movement, the locking plate 16 swings with the projection 36A as its center.

After the locking pin 16A pass the flat part adjoining the first slope 10C, it adjoins the point B and the pop-up unit 3 can't be pushed more. When the force to push the pop-up unit 3 gets weaker under this condition, the pop-up unit 3 is to move toward the direction Y again by the elasticity of the coil spring 26, but because of the locking pin 16A, which is designed not to move in the direction of the flat part adjoining the first slope 10C, the locking plate 16 is to be guided into the "V"-like groove 10D swinging in the opposite direction to that of before. In this time, when the force to push the pop-up unit 3 more gets weaker, the locking pin 16A is retained to the "V"-like groove 10D so that the pop-up unit 3 no more expands into the direction Y and it is retained, as illustrated in the FIG. 3, and the pop-up unit 3 is stored in the storage part of the pop-up unit 22.

When the pop-up unit 3 is stored in the storage part of the pop-up unit 22 as illustrated in the FIG. 3, if the pop-up unit 3 is pushed again, it is guided to the second slope 10E to adjoin the point C this time, because the locking pin 16A is designed not to move into the direction of the point B, and it can't be pushed any more. When the force to push the pop-up unit 3 gets weaker under this condition, the locking pin 10A slides in the third slope 10F again to the longer groove 10A, adjoins the point A by the elasticity of the coil spring 26, goes back as before (illustrated in the FIG. 2). After that, the locking pin 16A repeatedly circulates endlessly as mentioned before.

The Effect of the Invention

As explained above, in the pop-up mechanism and the PC card having it of this invention, the heart-cam is formed in the side of the frame and the relatively movable locking plate having the locking pin, which circulates endlessly in the groove of the heart-cam, which is different from the conventional structure so that there is the effect that the pop-up unit can expand longer than past PC cards, without the mechanism appeared outside.

And in the storage part of the locking plate, the apparatus that prevents the locking pin from running off the groove of the heart-cam is formed as a cantilever behind the locking plate, and by forming it as an integrated structure as the lower plate 34, The number of the components can be reduced and one manufacturing process can be cut down.

And because the pop-up unit is to expand outside by the elasticity of the coil spring, the coil spring is fixed to the supporting pin, which is fixed to the frame along the direction of the expanding and receding of the pop-up unit, at the same time the coil spring is inserted to the guide groove, whose section takes the shape of about the letter "C" and which is formed in the mentioned pop-up unit so as not to running off the groove, and the supporting pin is designed to have enough length the tip of which can reach the guide groove formed inside the pop-up unit when the pop-up unit is retained to the expanding position, there is the effect that the coil spring can be prevented from deformation or dropping out.

What is claimed is:

1. A pop-up mechanism comprising:
    a frame formed with a pair of side frame parts extending in parallel longitudinally and being spaced apart from each other with inward surfaces thereof facing opposite each other so as to define a storage space in between them, and a bridge part connecting the side frame parts by longitudinal ends thereof on a closed side of the frame, wherein the opposite longitudinal ends of the side frame parts define an open side of the frame;
    a pop-up unit fitting within the storage space of the frame and being movable by a biasing force to extend by a forward end thereof through the open side of the frame to an extended position outside the frame with a rearward end thereof retained within the frame, wherein said pop-up unit is adapted to be pressed back with its rearward end receding into the storage space of the frame against the biasing force to be retained within the storage space by a heart-cam mechanism until another pressing force is applied to release the pop-up unit to once again extend outside the frame, wherein said heart-cam mechanism is comprised of an elongated groove formed on the inward facing surface of one of said side frame parts, and a forward end of the elongated groove is positioned proximate the open side of the frame, and a rearward end of the groove is provided with a heart-cam retaining part for retaining the rearward end of the pop-up unit when the pop-up unit is pressed into the storage space of the frame, and wherein the rearward end of the pop-up unit has a holder and a locking plate held therein so as to face toward the elongated groove formed in the inward facing surface of said one side frame part, said locking plate having a locking pin and being capable of a swinging movement to allow relative movement of the locking pin with respect to the groove and the heart-cam retaining part in order to enable alternately the release of the pop-up unit to the extended position outside the frame and the retention of the pop-up unit within the storage space of the frame, whereby the cooperation of the locking plate and locking pin with the elongated groove on the inward facing surface of said one side frame part allows the pop-up unit to extend by a substantial length outside the frame without exposing the parts that enable its release and retention.

2. A pop-up mechanism according to claim 1, wherein the locking plate is pivotably held in a holding space formed in the holder and the holder is formed with a cantilever positioned behind the holding space so as to prevent the locking plate from dropping off the elongated groove and heart-cam retaining part.

3. A pop-up mechanism according to claim 2, wherein the locking plate is formed with body portion having a center hole for mounting it pivotably in the holding space and an elongated portion extending from the body portion on which the locking pin is mounted extending perpendicularly therefrom, and said locking pin is formed at an off-center position relative to the center hole in the body portion so that it can swing with a small amplitude relative to the retaining part of the heart-cam.

4. A pop-up mechanism according to claim 1, wherein the biasing force is provided by a coil spring that is installed with its coil on a supporting pin having one end fixed to a rearward portion of one side frame part, the other end of the coil extending into and held within a guide groove formed in a side portion of the pop-up unit having substantially a C-shaped cross section, and the supporting pin having a sufficient length that the other end thereof extends into the guide groove of the pop-up unit even when it is in the extended position.

5. A PC card having a thin planar main body formed with top and bottom planar surfaces substantially covered by radio-wave shielding material, and a pop-up unit held within the main body and capable of extending outside the main body, comprising:

the main body having a frame formed with a pair of side frame parts extending in parallel longitudinally and being spaced apart from each other with inward surfaces thereof facing opposite each other so as to define a storage space in between them, and a bridge part connecting the side frame parts by longitudinal ends thereof on a closed side of the frame, wherein the opposite longitudinal ends of the side frame parts define an open side of the frame;

the pop-up unit fitting within the storage space of the frame and being movable by a biasing force to extend by a forward end thereof through the open side of the frame to an extended position outside the frame with a rearward end thereof retained within the frame, wherein said pop-up unit is adapted to be pressed back with its rearward end receding into the storage space of the frame against the biasing force to be retained within the storage space by a heart-cam mechanism until another pressing force is applied to release the pop-up unit to once again extend outside the frame, wherein said heart-cam mechanism is comprised of an elongated groove formed on the inward facing surface of one of said side frame parts, and a forward end of the elongated groove is positioned proximate the open side of the frame, and a rearward end of the groove is provided with a heart-cam retaining part for retaining the rearward end of the pop-up unit when the pop-up unit is pressed into the storage space of the frame, and wherein the rearward end of the pop-up unit has a holder and a locking plate held therein so as to face toward the elongated groove formed in the inward facing surface of said one side frame part, said locking plate having a locking pin and being capable of a swinging movement to allow relative movement of the locking pin with respect to the groove and the heart-cam retaining part in order to enable alternately the release of the pop-up unit to the extended position outside the frame and the retention of the pop-up unit within the storage space of the frame, whereby the cooperation of the locking plate and locking pin with the elongated groove on the inward facing surface of said one side frame part allows the pop-up unit to extend by a substantial length outside the frame without exposing the parts that enable its release and retention.

* * * * *